(12) United States Patent
Gao et al.

(10) Patent No.: US 11,716,847 B2
(45) Date of Patent: Aug. 1, 2023

(54) THREE-DIMENSIONAL NAND MEMORY DEVICE WITH SPLIT GATES

(71) Applicant: Yangtze Memory Technologies Co., Ltd., Hubei (CN)

(72) Inventors: Tingting Gao, Wuhan (CN); Lei Xue, Wuhan (CN); Xiaoxin Liu, Wuhan (CN); Wanbo Geng, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 31 days.

(21) Appl. No.: 17/113,624

(22) Filed: Dec. 7, 2020

(65) Prior Publication Data

US 2022/0123012 A1 Apr. 21, 2022

Related U.S. Application Data

(63) Continuation of application No. PCT/CN2020/121808, filed on Oct. 19, 2020.

(51) Int. Cl.
*H01L 27/11551* (2017.01)
*H01L 27/11582* (2017.01)
(Continued)

(52) U.S. Cl.
CPC ......... *H10B 43/27* (2023.02); *H01L 23/5226* (2013.01); *H01L 29/40117* (2019.08); *H01L 29/4234* (2013.01)

(58) Field of Classification Search
CPC ... H01L 27/2481–249; H01L 27/11524; H01L 27/11529; H01L 23/5226;
(Continued)

(56) References Cited

U.S. PATENT DOCUMENTS 8,921,921 B2 12/2014 Ahn
9,305,849 B1 * 4/2016 Tsutsumi ............ H01L 27/1157
(Continued)

FOREIGN PATENT DOCUMENTS

CN 107623006 A 1/2018
CN 110931494 A 3/2020
(Continued)

OTHER PUBLICATIONS

Combined Chinese Office Action and Search Report dated Sep. 6, 2021 in Chinese Patent Application No. 202080003191.0 (with English translation of Category of Cited Documents), 11 pages.
(Continued)

*Primary Examiner* — Mary A Wilczewski
*Assistant Examiner* — Tsz K Chiu
(74) *Attorney, Agent, or Firm* — Oblon, McClelland, Maier & Neustadt, L.L.P.

(57) ABSTRACT

A semiconductor device is provided. The semiconductor device includes word line layers and insulating layers that are alternatingly stacked along a vertical direction perpendicular to a substrate of the semiconductor device. The semiconductor device includes a channel structure that extends along the vertical direction through the word line layers and the insulating layers. A cross-section of the channel structure that is perpendicular to the vertical axis includes channel layer sections that are spaced apart from one another.

20 Claims, 12 Drawing Sheets

(51) Int. Cl.
*H10B 43/27* (2023.01)
*H01L 21/28* (2006.01)
*H01L 23/522* (2006.01)
*H01L 29/423* (2006.01)

(58) Field of Classification Search
CPC .......... H01L 29/40117; H01L 29/4234; G11C 16/0483; H10B 43/27; H10B 41/27; H10B 41/35; H10B 43/35
See application file for complete search history.

(56) References Cited

U.S. PATENT DOCUMENTS

| | | | | |
|---|---|---|---|---|
| 9,754,963 | B1* | 9/2017 | Kawamura | H01L 27/11565 |
| 9,853,050 | B2* | 12/2017 | Kikutani | H01L 27/11556 |
| 10,068,917 | B2* | 9/2018 | Kanamori | H01L 27/11582 |
| 10,090,318 | B2* | 10/2018 | Zhu | H01L 21/31111 |
| 10,103,165 | B2 | 10/2018 | Son et al. | |
| 10,276,583 | B2* | 4/2019 | Sharangpani | H01L 27/0688 |
| 10,497,711 | B2* | 12/2019 | Baraskar | H10B 43/35 |
| 10,566,346 | B2* | 2/2020 | Lee | H01L 27/11568 |
| 2009/0230454 | A1* | 9/2009 | Pekny | H01L 27/11582 |
| | | | | 438/257 |
| 2010/0038699 | A1* | 2/2010 | Katsumata | H01L 29/66833 |
| | | | | 257/E21.409 |
| 2010/0207194 | A1* | 8/2010 | Tanaka | H01L 27/11578 |
| | | | | 438/588 |
| 2010/0308398 | A1* | 12/2010 | Shin | G11C 16/0483 |
| | | | | 257/324 |
| 2012/0306089 | A1* | 12/2012 | Freeman | H01L 27/11575 |
| | | | | 257/773 |
| 2014/0035023 | A1 | 2/2014 | Ahn | |
| 2014/0203442 | A1* | 7/2014 | Yun | H01L 27/11548 |
| | | | | 257/773 |
| 2015/0236038 | A1* | 8/2015 | Pachamuthu | H01L 21/8221 |
| | | | | 257/326 |
| 2015/0318296 | A1* | 11/2015 | Kim | H01L 27/11519 |
| | | | | 257/296 |
| 2016/0104715 | A1* | 4/2016 | Pachamuthu | H01L 27/11575 |
| | | | | 257/326 |
| 2016/0293625 | A1* | 10/2016 | Kang | H01L 27/11565 |
| 2016/0322381 | A1* | 11/2016 | Liu | H01L 27/11526 |
| 2016/0365351 | A1* | 12/2016 | Nishikawa | H01L 27/11556 |
| 2017/0040337 | A1* | 2/2017 | Kim | H01L 27/11573 |
| 2017/0047334 | A1* | 2/2017 | Lu | H01L 27/11519 |
| 2017/0062456 | A1 | 3/2017 | Sugino et al. | |
| 2017/0110462 | A1* | 4/2017 | Akutsu | H01L 23/5226 |
| 2017/0236746 | A1* | 8/2017 | Yu | H01L 21/76805 |
| | | | | 257/314 |
| 2017/0309635 | A1* | 10/2017 | Kim | H01L 27/0688 |
| 2017/0338243 | A1 | 11/2017 | Sohn et al. | |
| 2018/0019257 | A1 | 1/2018 | Son et al. | |
| 2019/0296033 | A1* | 9/2019 | Kinoshita | H01L 29/7926 |
| 2019/0371813 | A1* | 12/2019 | Oike | H01L 23/528 |
| 2020/0083248 | A1 | 3/2020 | Uchida | |
| 2020/0091181 | A1* | 3/2020 | Nagashima | H01L 27/11582 |
| 2020/0098767 | A1* | 3/2020 | Morooka | H01L 27/1157 |
| 2020/0098782 | A1* | 3/2020 | Nojima | H01L 27/1157 |
| 2020/0098787 | A1 | 3/2020 | Morooka | |
| 2020/0119031 | A1* | 4/2020 | Shen | H01L 27/11575 |
| 2020/0235113 | A1 | 7/2020 | Oh et al. | |
| 2021/0272977 | A1* | 9/2021 | Shimizu | H01L 27/11565 |
| 2021/0288064 | A1* | 9/2021 | Nishimura | H01L 27/11556 |
| 2021/0358937 | A1* | 11/2021 | Yamaguchi | H01L 27/11565 |

FOREIGN PATENT DOCUMENTS

| | | |
|---|---|---|
| CN | 111279465 A | 6/2020 |
| CN | 111477630 A | 7/2020 |
| CN | 112106199 A | 12/2020 |
| CN | 112106200 A | 12/2020 |
| TW | 201639126 A | 11/2016 |
| TW | 202013689 A | 4/2020 |

OTHER PUBLICATIONS

International Search Report dated Jul. 15, 2021 n PCT/CN2020/121808, 4 pages.

Combined Chinese Office Action and Search Report dated Aug. 24, 2022 in Chinese Patent Application No. 202080003191.0 (with Translation of Category of Cited Documents), 13 pages.

* cited by examiner

THREE-DIMENSIONAL NAND MEMORY DEVICE WITH SPLIT GATES

BACKGROUND

This application is a bypass continuation of International Application No. PCT/CN2020/121808, filed on Oct. 19, 2020. The entire disclosure of the prior application is hereby incorporated by reference in its entirety.

BACKGROUND

Flash memory devices have recently been through a rapid development. The flash memory devices are able to retain the stored data for a long period of time without applying a voltage. Further, the reading rate of the flash memory devices is relatively high, and it is easy to erase stored data and rewrite data into the flash memory devices. Thus, the flash memory devices have been widely used in microcomputers, automatic control systems, and the like. To increase the bit density and reduce the bit cost of the flash memory devices, three-dimensional (3D) NAND (Not AND) flash memory devices have been developed.

In recent years, as the cell layers of the 3D-NAND exceeds 100 layer, it is increasingly challenging to manage trade-offs among an etch profile control, a size uniformity and a productivity. For example, as the bit density of the 3D-NAND memory device increases, the alignment issue of the channel holes in different stacks (e.g., an upper stack and a lower stack) or the connection issue of the high dense channel holes based on a double pattern is getting worse.

SUMMARY

In the present disclosure, embodiments directed to a 3D-NAND memory device with split gates and a method of manufacturing the same are provided.

In the present disclosure, a semiconductor device is provided. The semiconductor device can include word line layers and insulating layers that are alternatingly stacked along a vertical direction perpendicular to a substrate of the semiconductor device. The semiconductor device can include a channel structure that extends through the word line layers and the insulating layers along the vertical direction. A cross-section of the channel structure that is perpendicular to the vertical direction can include channel layer sections that are spaced apart from one another.

The semiconductor device can further include a gate dielectric structure that extends in the vertical direction, and a gate function structure that extends in the vertical direction. A cross-section of the gate dielectric structure that is perpendicular to the vertical direction can have a closed-loop configuration, and a cross-section of the gate function structure that is perpendicular to the vertical direction can have an open-loop configuration.

In some embodiments, the gate dielectric structure can include a barrier layer, a charge trapping layer, and a tunneling layer. The gate function structure can include the channel layer sections. The barrier layer can extend in the vertical direction and be in direct contact with the word line layers and the insulating layers. The charge trapping layer can be formed over an inner surface of the barrier layer, and a tunneling layer can be formed over an inner surface of the charge trapping layer, where the channel layer sections can be arranged over an inner surface of the tunneling layer and spaced apart from one another by a dielectric layer.

In some embodiments, the gate dielectric structure can include a barrier layer and a charge trapping layer. The gate function structure can include tunneling layer sections and the channel layer sections. The barrier layer can extend in the vertical direction and be in contact with the word line layers and the insulating layers. The charge trapping layer can be formed over an inner surface of the barrier layer. The tunneling layer sections can be formed over an inner surface of the charge trapping layer, and spaced apart from one another by a dielectric layer. The channel layer sections can be arranged over inner surfaces of the tunneling layer sections, and spaced apart from one another by a dielectric layer.

In an exemplary embodiment, the gate dielectric structure can include a barrier layer, and the gate function structure can include charge trapping layer sections, tunneling layer sections and the channel layer sections. The barrier layer can extend in the vertical direction and be in contact with the word line layers and the insulating layers. The charge trapping layer sections can be formed over an inner surface of the barrier layer and spaced apart from one another by a dielectric layer. The tunneling layer sections can be formed over inner surfaces of the charge trapping layer, and spaced apart from one another by the dielectric layer. The channel layer sections can be arranged over inner surfaces of the tunneling layer sections and spaced apart from one another by the dielectric layer.

In the channel structure of the semiconductor device, a first channel layer section of the channel layer sections can be positioned along a first tunneling layer section of the tunneling layer sections, and the first tunneling layer section of the tunneling layer sections can be positioned along a first charge trapping layer section of the charge trapping layer sections.

In some embodiments, the cross-section of the channel structure can have one of an oval profile, a star profile, a trefoil profile, or a quatrefoil profile. In addition, a ratio of a first long axis of the cross-section of the channel structure and a first short axis of the cross-section of the channel structure can be in a range of ½ to ⅗.

In some embodiments, a first pair of the channel layer sections can be separately arrange along the first long axis of the cross-section of the channel structure. A second pair of the channel layer sections can be separately arranged along a second long axis of the cross-section.

According to another aspect of the disclosure, a method for forming a semiconductor is provided. In the method, word line layers and insulating layers can be alternatingly stacked along a vertical direction perpendicular to a substrate. A channel structure can subsequently be formed, where the channel structure can extend along the vertical direction through the word line layers and the insulating layers. A cross-section of the channel structure that is perpendicular to the vertical direction can include a short axis and a long axis. An etching process can be performed to etch a channel layer of the channel structure to form channel layer sections in the channel structure, where the channel layer sections can be spaced apart from one another.

In some embodiments, in order to form the channel structure, a channel hole can be formed at first. The channel hole can extend through the word line layers and the insulating layers along the vertical direction. The channel hole can have sidewalls and a bottom. A cross-section of the channel hole that is perpendicular to the vertical axis can include the short axis and the long axis. A barrier layer can be formed along the sidewalls of the channel hole, where the barrier layer can be concentrically positioned around the vertical axis and in direct contact with the word line layers and the insulating layers. A charge trapping layer can be formed over an inner surface of the barrier layer. A tunneling layer can be formed over an inner surface of the charge trapping layer. Further, the channel layer can be formed over an inner surface of the tunneling layer. An isolation layer can be formed over an inner surface of the channel layer, where a gap can be positioned in the channel structure and surrounded by the isolation layer.

In alternative embodiments, the cross-section of the channel structure can have one of an oval profile, a star profile, a trefoil profile, or a quatrefoil profile. In some embodiments, a ratio of the long axis and the short axis of the channel structure can be in a range of ½ to ⅗.

In some embodiments, the etching process can be performed to etch the isolation layer and the channel layer so that the gap is enlarged and the channel layer is etched into the channel layer sections that are separately arranged along the long axis of the cross-section of the channel structure. A dielectric layer can subsequently be deposited in the gap so that the channel layer sections are spaced apart from one another by the dielectric layer.

In some embodiments, the etching process can be performed to etch the isolation layer, the channel layer, the tunneling layer and the charge trapping layer. A dielectric layer can subsequently be deposited in the gap that is enlarged by the etching process. Accordingly, the channel layer can be etched into the channel layer sections that are spaced apart from one another by the dielectric layer and arranged along the long axis of the cross-section of the channel structure. The tunneling layer can be etched into tunneling layer sections that are spaced apart from one another by the dielectric layer and arranged along the long axis of the cross-section of the channel structure. The charge trapping layer can be etched into charge trapping layer sections that are spaced apart from one another by the dielectric layer and arranged along the long axis of the cross-section of the channel structure.

When the isolation layer, the channel layer, the tunneling layer and the charge trapping layer are etched by the etching process, a first channel layer section of the channel layer sections can be formed along a first tunneling layer section of the tunneling layer sections, and the first tunneling layer section of the tunneling layer sections can be formed along a first charge trapping layer section of the charge trapping layer sections.

According to another aspect of the disclosure, a semiconductor device is provided. The semiconductor device can include an array region and a staircase region. The array region and the staircase region can be positioned adjacent each other and formed in a stack of alternating word line layers and insulating layers that is formed over a substrate of the semiconductor device. The semiconductor device can also include a channel structure. The channel structure can be disposed in the array region and extend through the stack along a vertical direction perpendicular to the substrate. The semiconductor can include word line contacts that are formed in the staircase region, where the word line contacts extend from the word line layers of the staircase region along the vertical direction. A cross-section of the channel structure that is perpendicular to the vertical direction can include channel layer section, where the channel layer sections can be spaced apart from one another.

In some embodiments, the channel structure can include a gate dielectric structure and a gate function structure. The gate dielectric structure can include a barrier layer, a charge trapping layer, and a tunneling layer. The gate function structure can include the channel layer sections. The barrier layer can extend in the vertical direction and be in contact with the word line layers and the insulating layers. The charge trapping layer can be formed over an inner surface of the barrier layer. The tunneling layer can be formed over an inner surface of the charge trapping layer. The channel layer sections can be arranged over an inner surface of the tunneling layer and spaced apart from one another by a dielectric layer.

In other embodiments, the channel structure can include a gate dielectric and a gate function structure. The gate dielectric structure can include a barrier layer and a charge trapping layer. The gate function structure can include tunneling layer sections and the channel layer sections. The barrier layer can extend in the vertical direction and be in contact with the word line layers and the insulating layers. The charge trapping layer can be formed over an inner surface of the barrier layer. The tunneling layer sections can be formed over an inner surface of the charge trapping layer, and spaced apart from one another by a dielectric layer. The channel layer sections can be arranged over inner surfaces of the tunneling layer sections, and spaced apart from one another by a dielectric layer.

In some embodiments, the channel structure can include a gate dielectric structure that include a barrier layer, and a gate function structure that includes charge trapping layer sections, tunneling layer sections and the channel layer sections. The barrier layer can extend in the vertical direction and be in contact with the word line layers and the insulating layers. The charge trapping layer sections can be formed over an inner surface of the barrier layer and spaced apart from one another by a dielectric layer. The tunneling layer sections can be formed over inner surfaces of the charge trapping layer, and spaced apart from one another by the dielectric layer. The channel layer sections can be arranged over inner surfaces of the tunneling layer sections and spaced apart from one another by the dielectric layer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
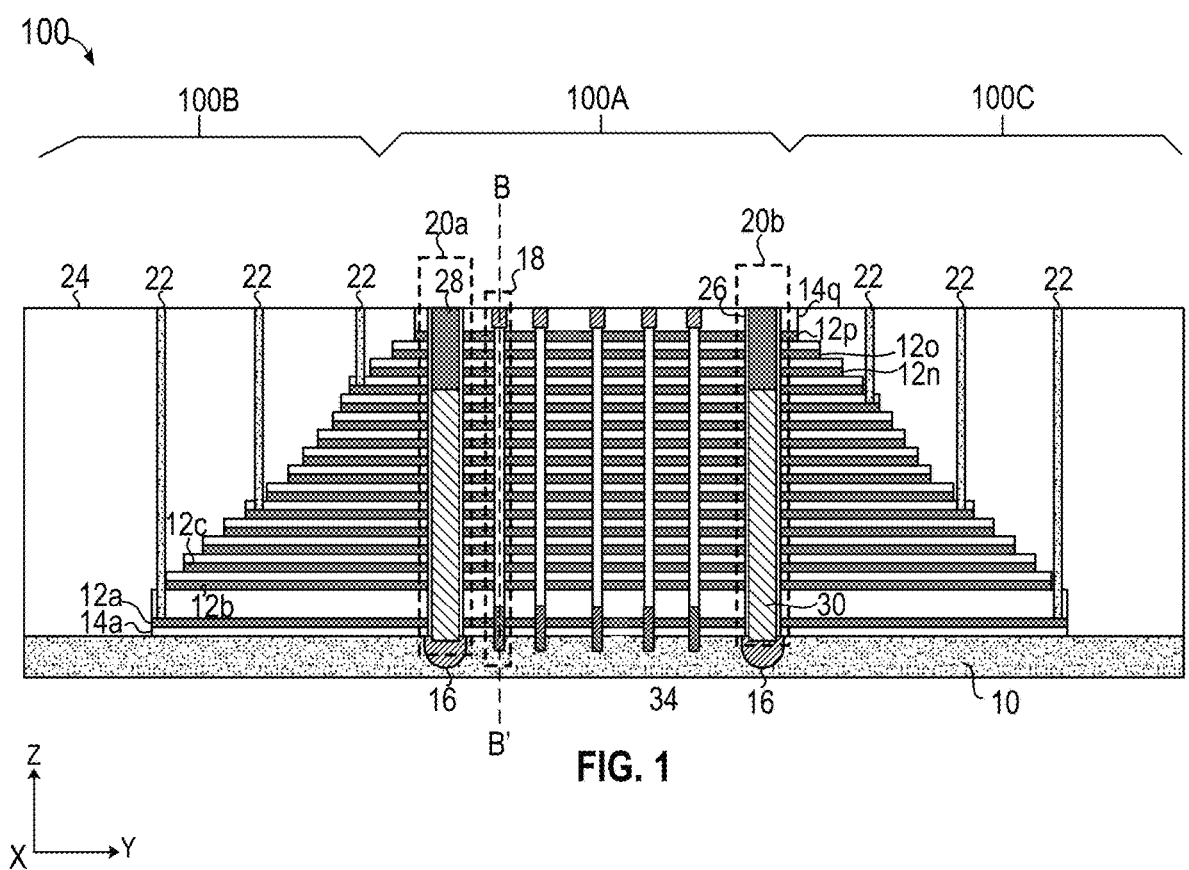
FIG. 1 is cross-sectional view of an exemplary 3D-NAND device, in accordance with exemplary embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features may be in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A 3D-NAND device can include staircase regions and array regions that are formed in a stack of word line layers and insulating layers. The word line layers and the insulating layers can be disposed alternatingly over a substrate. The word line layers can include bottom select gate (BSG) layers, gate layers (or word line layers), and top select gate (TSG) layers that are disposed sequentially over the substrate. The array regions can include a plurality of channel structures. Each of the channel structures can be coupled to the word line layers to form a respective vertical NAND memory cell string. The vertical NAND memory cell string can include one or more bottom select transistors (BSTs), a plurality of memory cells (MCs), and one or more top select transistors (TSTs) that are disposed sequentially and in series over the substrate along a height direction (or Z direction) of the substrate. The BSTs can be formed of the channel structure and the BSG layers, the MCs can be formed of the channel structure and the word line layers, and the TSTs can be formed of the channel structure and the TSG layers.

In such a 3D-NAND device, the staircase regions can include stairs that are formed in the BSG layers, the word line layers, and the TSG layers. Word line contacts can further be formed on the stairs to connect to the BSG layers, the word line layers, and the TSG layers.

In a related example, a channel structure can be formed through a channel hole with multiple layers of material concentrically arranged, for example, circularly about a central axis. The channel hole can be a concentric circle, and the multiple layers can include a barrier layer (e.g., SiO layer), a charge trapping layer (e.g., SiN layer), a tunneling layer (e.g., SiO layer), and a channel layer (e.g., a poly Si layer) that are sequentially filled in the concentric circle. In addition, the concentric circle can be filled with an insolation layer (e.g., SiO layer) so as to form a continuous charge capture memory structure from a top to a bottom of the channel structure. The advantage of forming such a channel structure is that the storage density can be maximized by increasing the density of concentric circles and the number of stacking layers at the minimum cost. However, as the bit density of the 3D-NAND memory device increases, the alignment issue of the channel holes in different stacks (e.g., an upper stack and a lower stack) or the connection issue of the channel holes based on a double pattern is getting worse.

In the disclosure, the bit density of the 3D-NAND can be improved based on split gates (or split cells). The split cells can be formed by splitting the channel layer into channel layer sections in a channel structure. Thus, a single memory cell string can be split into multiple memory cell strings. In order to split the channel layer, the channel structure can be formed based on a channel hole that has an anisotropic profile, such as an oval profile (or semi ellipse profile) with a long axis and a short axis. An etching process (e.g., a wet etching or a dry etching) can therefore be applied to etch the channel layer. Sections of the channel layer along the long axis can remain and sections of the channel layer along the short axis can be removed. In some embodiments, the etching process can further cut the tunneling layer and the charge trapping layer into tunneling layer sections and charge trapping layer sections so as to reduce the disturb between the memory cell strings and improve the reliability FIG. 1 is a cross-sectional view of an exemplary 3D-NAND memory device 100 (also referred to as device 100). As shown in FIG. 1, the 3D-NAND memory device 100 can have a substrate 10. A plurality of word line layers 12 and a plurality of insulating layers 14 are stacked alternatingly over the substrate 10. In the exemplary embodiment of FIG. 1, 16 word line layers and 17 insulating layers are included. It should be noted that FIG. 1 is merely an example, and any number of word line layers and insulating layers can be included based on the device structure.

In some embodiments, a lowermost word line layer 12a can function as a bottom select gate (BSG) layer that is connected to a gate of a BST. In some embodiments, one or more of the word line layers over the BSG layer 12a, such as word line layer 12b-12c, can be dummy word line layers (or dummy BSG layers) that are connected to gates of dummy memory cells (dummy MCs). The BST and the dummy MCs together can control data transmission between array common source (ACS) regions 16 and the memory cells.

In some embodiments, an uppermost word line layer 12p can function as a top select gate (TSG) layer that is connected to a gate of a TST. In some embodiments, one or more of the word line layers under the TSG layer 12p, such as word line layers 12n-12o, can be dummy word line layers (or dummy TSG layers) that are connected to gates of dummy memory cells (dummy MCs). The TST and the dummy MCs together control data transmission between bit lines (not shown) and the memory cells.

The insulating layers are positioned on the substrate 10 and arranged with the word line layers alternatingly. The word line layers are spaced part from one another by the insulating layers. In addition, the word line layers are separated from the substrate 10 by a lowermost insulating layer 14a of the insulating layers.

In some embodiments, the word line layers illustrated in FIG. 1 are formed first using sacrificial word line layers (e.g., SiN). The sacrificial word line layers can be removed and replaced with a high K layer, glue layers and one or more metal layers. The high K layer can be made of aluminum oxide ($Al_2O_3$) and/or Hafnium oxide ($HfO_2$) and/or Tantalum oxide ($Ta_2O_5$), and/or another material of high K (Dielectric Constant). The metal layer can be made of tungsten (W), Cobalt (Co), for example. The word lines can have a thickness in a range from 10 nm to 100 nm, according to requirements of product specification, device operation, manufacturing capabilities, and so on. In an embodiment of FIG. 1, the insulating layers can be made of $SiO_2$ with a thickness from 5 nm to 50 nm.

In some embodiments, the 3D-NAND memory device 100 can have an array region 100A and two staircase regions 100B-100C. The staircase regions 100B-100C can be positioned at two sides of the array region 100A. The word line layers and the insulating layers can extend into the staircase region 100B-100C with a stair-cased profile or step-cased profile.

The 3D-NAND memory device 100 can include a plurality of channel structures 18 in the array region 100A. The channel structures 18 are formed over the substrate 10 along a Z-direction (also referred to as vertical direction or height direction) of the substrate. As shown in FIG. 1, five channel structures 18 are included. However, FIG. 1 is merely an example, and any number of channel structures 18 can be included in the 3D-NAND memory device 100. The channel structures 18 can extend through the word line layers 12 and the insulating layers 14, and further extend into the substrate 10 to form an array of vertical memory cell strings. Each of the vertical memory cell strings can include a corresponding channel structure that is coupled to the word line layers 12 to form one or more bottom select transistors (BSTs), a plurality of memory cells (MCs), and one or more top select transistors (TSTs). The BSTs, MCs, and TSTs are disposed sequentially and in series over the substrate. In addition, each of the channel structures 18 can further include a channel layer, a tunneling layer, a charge trapping layer, and a barrier layer that are concentrically arranged around a vertical axis B-B'.

The 3D-NAND memory device 100 can have a plurality of slit structures (or gate line slit structures). For example, two slit structures 20a-20b are included in FIG. 1. In some embodiments, a gate-last fabrication technology is used to form the 3D-NAND memory device 100, thus the slit structures are formed to assist in the removal of the sacrificial word line layers, and the formation of the real gates. In some embodiments, the slit structures can be made of conductive materials and positioned on array common source (ACS) regions 16 to serve as contacts, where the ACS regions are formed in the substrate 10 to serve as common sources. In some embodiments, the slit structures can be made of dielectric materials to serve as separation structures. In an exemplary embodiment of FIG. 1, the slit structures 20a-20b are positioned at two opposing boundaries of the array region 100A and connected to the ACS regions 16.

In some embodiments, the slit structures 20a-20b can extend through the word line layers 12 and the insulating layers 14, and further extend along a first direction (also referred to as a length direction, or a X direction) of the substrate 10. In some embodiments, the slit structures 20a-20b can have a dielectric spacer 26, a conductive layer 30, and a contact 28. The dielectric spacer 26 is formed along sidewalls of the slit statures and in direct contact with the word line layers and the insulating layers. The conductive layer 30 is formed along the dielectric spacer 26 and over the ACS regions 16. The contact 28 is formed along the dielectric spacer 26 and over the conductive layer 30. In an embodiment of FIG. 1, the dielectric spacer 26 is made of $SiO_2$, the conductive layer 30 is made of polysilicon, and the contact 28 is made of tungsten.

The 3D-NAND memory device 100 can have a plurality of word line contact structures 22. The word line contact structures 22 are formed in a dielectric layer 24 and positioned on the word line layers 12 to connect to the word line layers 12. For simplicity and clarity, only three word line contact structures 22 are illustrated in each of the staircase regions 100B and 100C. The word line contact structures 22 can further be coupled to gate voltages. The gate voltages can be applied to gates of the BSTs, the MCs, and the TSTs through the word line layers to operate the BSTs, the MCs, and the TSTs correspondingly.

Figure 2A:
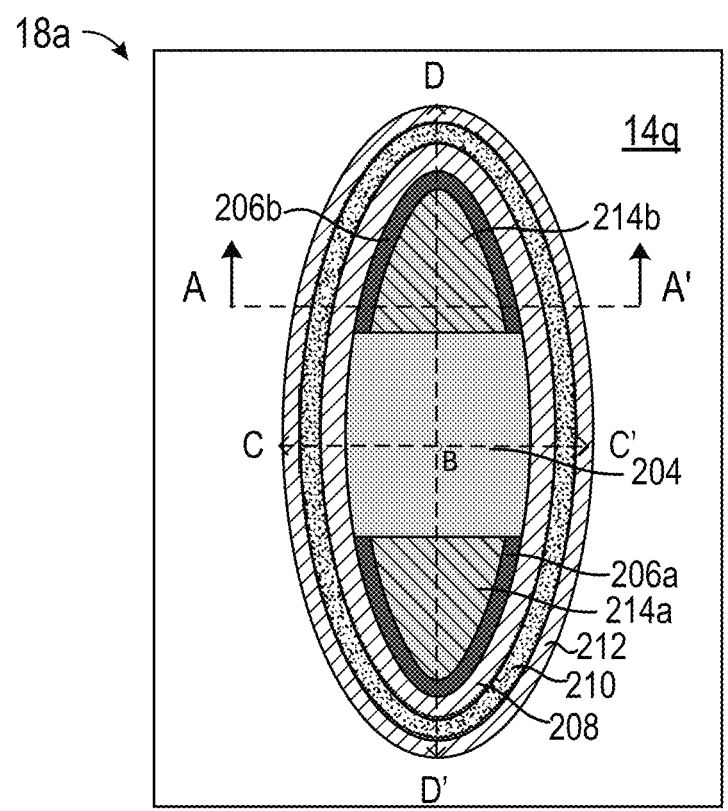
FIG. 2A is a top-down view of a first exemplary channel structure, in accordance with exemplary embodiments of the disclosure.

FIG. 2A is a top-down view showing a cross-section of a first exemplary channel structure 18a that is perpendicular to the vertical axis B-B'. As shown in FIG. 2A, the channel structure 18a can include an oval cross-section. The oval cross-section can include a short axis C-C' and a long axis D-D' that are perpendicular to the vertical axis B-B'. The channel structure 18a can have a barrier layer 212 that is formed in the Z-direction (or vertical direction), where the barrier layer 212 is in direct contact with the word line layers 12 and the insulating layers 14. The channel structure 18a can include a charge trapping layer 210 that is formed over an inner surface of the barrier layer 212, and a tunneling layer 208 that is formed over an inner surface of the charge trapping layer 210. The channel structure 18a can further include a channel layer that has an open-loop configuration and includes channel layer sections 206a and 206b over an inner surface of the tunneling layer 208. In some embodiments, the barrier layer 212, the charge trapping layer 210, the tunneling layer 208, and the channel layer sections 206a and 206b can be arranged concentrically around the vertical axis B-B' in the Z-direction. In addition, the channel layer sections 206a and 206b can be separately arranged along the long axis D-D'.

Still referring to FIG. 2A, a dielectric layer 204 can be disposed between the channel layer sections 206a and 206b so that the channel layer sections 206a and 206b are spaced apart from one another. The dielectric layer 204 can further be arranged along inner surfaces of the channel layer sections 206a and 206b, and the inner surface of the tunneling layer 208. The channel structure 18a can include top channel contacts 214a and 214b that are formed along the inner surfaces of the channel layer sections 206a and 206b. For example, the top channel contact 214a can be formed along the inner surface of the channel layer section 206a, and the top channel contact 214b can be formed along the inner surface of the channel layer section 206b.

In some embodiment, the short axis C-C' and the long axis D-D' of the oval cross-section of the channel structure 18a can have a range between ½ and ⅗.

The channel structure 18a in FIG. 2A illustrate a bi-phase split cell configuration, where two separate memory cell strings can be formed based on the channel structure 18a that has a channel layer in an open-loop configuration. For example, a first memory cell string can be formed based on the channel layer section 206a, the top channel contact 214a, the barrier layer 212, the charge trapping layer 210, and the tunneling layer 208. A second memory cell can be formed based on the channel layer section 206b, the top channel contact 214b, the barrier layer 212, the charge trapping layer 210, and tunneling layer 208. In a related device, the channel layer can have a closed-loop configuration. Thus, the bit density of the device 100 can be doubled comparing to the related device.

Figure 2B:
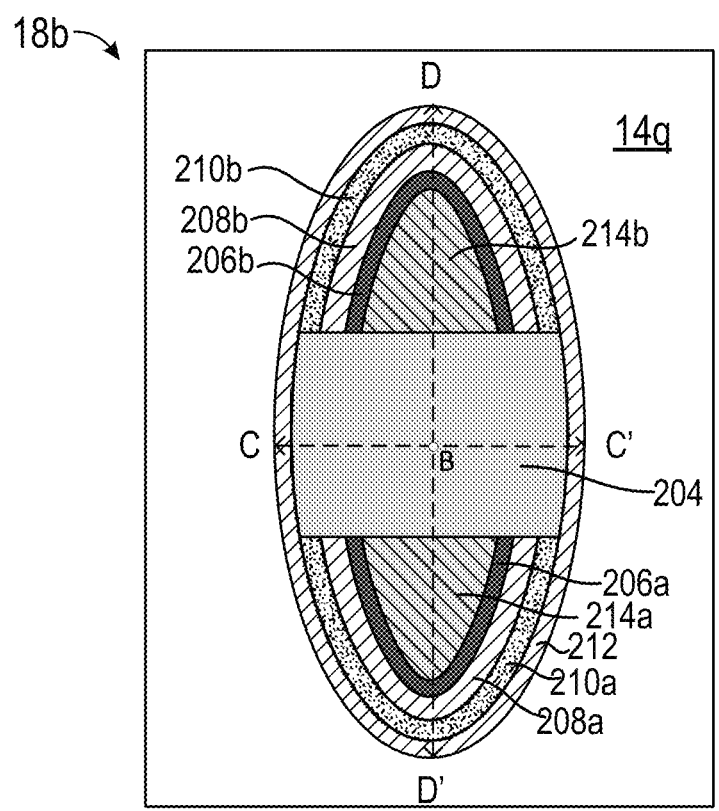
FIG. 2B is a top-down view of a second exemplary channel structure, in accordance with exemplary embodiments of the disclosure.

FIG. 2B is a top-down view showing a cross-section of a second exemplary channel structure 18b that is perpendicular to the vertical axis B-B'. Comparing to the channel structure 18a in FIG. 2A, the tunneling layer 208 and the charge trapping layer 210 can also be separated by the dielectric layer 204 in the channel structure 18b. As shown in FIG. 2B, the tunneling layer 208 can have an open-loop configuration and include tunneling layer sections 208a and 208b that are arranged along the long axis D-D' of the cross-section of the channel structure 18b. The charge trapping layer 210 can have an open-loop configuration and include charge trapping layer sections 210a and 210b that are arranged along the long axis D-D'. In some embodiments, the barrier layer 212, the charge trapping layer sections 210a and 210b, the tunneling layer sections 208a and 208b, and the channel layer sections 206a and 206b can be concentrically arranged around the vertical axis B-B' in the Z-direction.

Still referring to FIG. 2B, a first memory cell string can be formed based on the channel layer section 206a, the top channel contact 214a, the barrier layer 212, the charge trapping layer section 210a, and the tunneling layer section 208a, where the channel layer section 206a is positioned along an inner surface of the tunneling layer section 208a, and the tunneling layer section 208a is arranged along an inner surface of the charge trapping layer section 210a. A second memory cell can be formed based on the channel layer section 206b, the top channel contact 214b, the barrier layer 212, the charge trapping layer section 210b, and tunneling layer section 208b, where the channel layer section 206b is positioned along an inner surface of the tunneling layer section 208b, and the tunneling layer section 208b is arranged along an inner surface of the charge trapping layer section 210b. By introducing the open-loop configuration into the tunneling layer and the charge trapping layer, data disturbing can be prevented in the first and second memory cell strings and device reliabilities can be improved in the device 100.

Figure 2C:
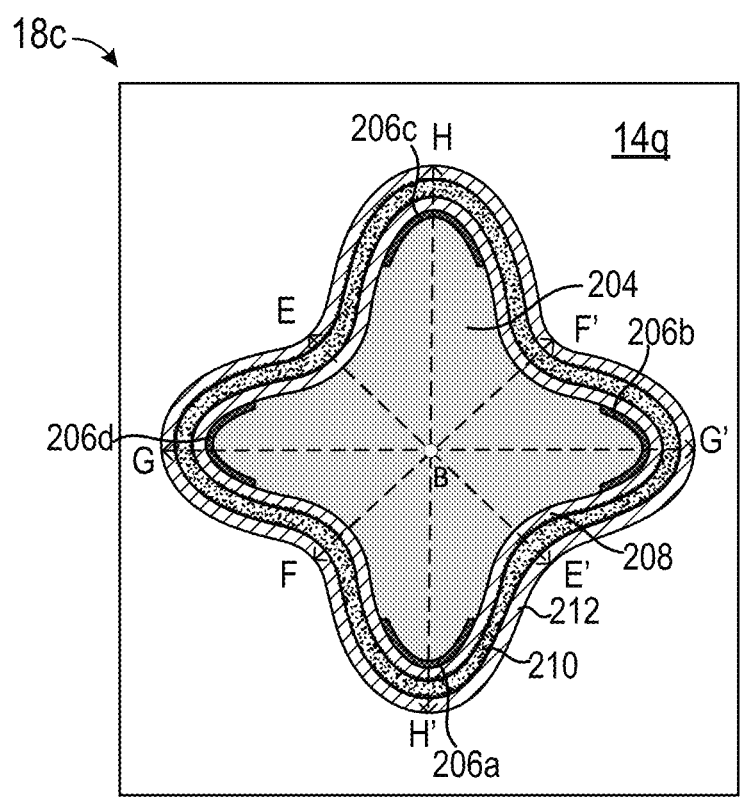
FIG. 2C is a top-down view of a third exemplary channel structure, in accordance with exemplary embodiments of the disclosure.

FIG. 2C is a top-down view showing a cross-section of a third exemplary channel structure 18c that is perpendicular to the vertical axis B-B'. As shown in FIG. 2C, the channel structure 18c can have a quatrefoil cross-section that includes short axes E-E' and F-F', and long axes G-G' and H-H'. The short axes E-E' and F-F', and long axes G-G' and H-H' can be perpendicular to a vertical axis B-B'. In some embodiments, a ratio of the short axis and the long axis can have a range of ½ to ⅗. The channel structure 18c can have a barrier layer 212 that is formed in the Z-direction (or vertical direction), where the barrier layer 212 is in direct contact with the word line layers 12 and the insulating layers 14. The channel structure 18c can include a charge trapping layer 210 that is formed over an inner surface of the barrier layer 212, and a tunneling layer 208 that is formed over an inner surface of the charge trapping layer 210. The channel structure 18a can further include a channel layer 206 that has an open-loop configuration. For example, the channel layer 206 can be formed of four channel layer sections 206a-206d over an inner surface of the tunneling layer 208.

In some embodiments, the barrier layer 212, the charge trapping layer 210, the tunneling layer 208, and the channel layer sections 206a-206d can be arranged concentrically around the vertical axis B-B' in the Z-direction. In addition, the channel layer sections 206a-206d can be spaced apart from one another and arranged along the long axes G-G' and H-H'. In an exemplary embodiment of FIG. 2C, the channel layer sections 206a and 206c can be arranged long the long axis H-H', and the channel layer sections 206b and 206d can be arranged long the long axis G-G'. The channel structure 18c can also include a dielectric layer 204 that is disposed along inner surfaces of the tunneling layer 208 and the channel layer sections 206a-206d. The dielectric layer 204 can further be arranged among the 206a-206d so that the channel layer sections 206a-206d are spaced apart from one another by the dielectric layer 204. For simplicity and clarity, top channel contacts of the channel structure 18c that can be formed along the inner surfaces of the channel layer sections 206a-206d are not provided in FIG. 2C.

The channel structure 18c in FIG. 2C illustrates a quadrphase split cell configuration, where four separate memory cell strings can be formed based on the channel structure 18c and the word line layers 12. For example, a first memory cell string can be formed based on the channel layer section 206a, the barrier layer 212, the charge trapping layer 210, and the tunneling layer 208. A second memory cell can be formed based on the channel layer section 206b, the barrier layer 212, the charge trapping layer 210, and tunneling layer 208. A third memory cell can be formed based on the channel layer 206c, the barrier layer 212, the charge trapping layer 210, and tunneling layer 208, and a fourth memory cell can be formed based on the channel layer 206d, the barrier layer 212, the charge trapping layer 210, and tunneling layer 208. Thus, the bit density of the device 100 can be quadrupled comparing to the related device.

Figure 2D:
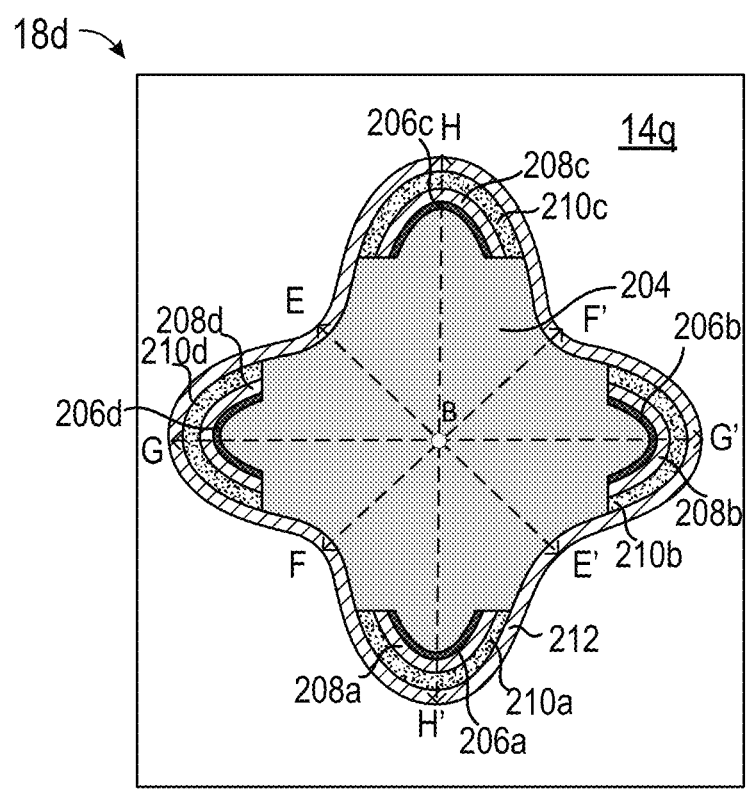
FIG. 2D is a top-down view of a fourth exemplary channel structure, in accordance with exemplary embodiments of the disclosure.

FIG. 2D is a top-down view showing a cross-section of a fourth exemplary channel structure 18d that is perpendicular to the vertical axis B-B'. Comparing to the channel structure 18c in FIG. 2C, the tunneling layer 208 and the charge trapping layer 210 can also be separated by the dielectric layer 204 in the channel structure 18d. As shown in FIG. 2D, the tunneling layer 208 can have an open-loop configuration and include tunneling layer sections 208a-208d that are arranged along the long axes G-G' and H-H'. The charge trapping layer 210 can have an open-loop configuration and include charge trapping layer sections 210a-210d that are arranged along the long axes G-G' and H-H'. In some embodiments, the barrier layer 212, the charge trapping layer sections 210a-210d, the tunneling layer sections 208a-208d, and the channel layer sections 206a-206d can be arranged concentrically around the vertical axis B-B' in the Z-direction. The dielectric layer 204 can be formed along inner surfaces of the channel layer sections 206a-206d, and the barrier layer 212. Accordingly, the dielectric layer 204 can extend along the short axes E-E' and F-F' to separate the channel layer sections 206a-206d, the tunneling layer sections 208a-208d, and the charge trapping layer sections 210a-210d.

In the channel structure 18d, a first memory cell string can be formed based on the channel layer section 206a, the barrier layer 212, the charge trapping layer section 210a, and the tunneling layer section 208a. A second memory cell can be formed based on the channel layer section 206b, the barrier layer 212, the charge trapping layer section 210b, and tunneling layer section 208b. A third memory cell can be formed based on the channel layer 206c, the barrier layer 212, the charge trapping layer 210c, and tunneling layer 208c. A fourth memory cell can be formed based on the channel layer 206d, the barrier layer 212, the charge trapping layer 210d, and tunneling layer 208d. By introducing the open-loop configuration into the tunneling layer and the charge trapping layer, data disturbing can be prevented in the four memory cell strings and device reliability can be improved in the device 100.

Figure 3:
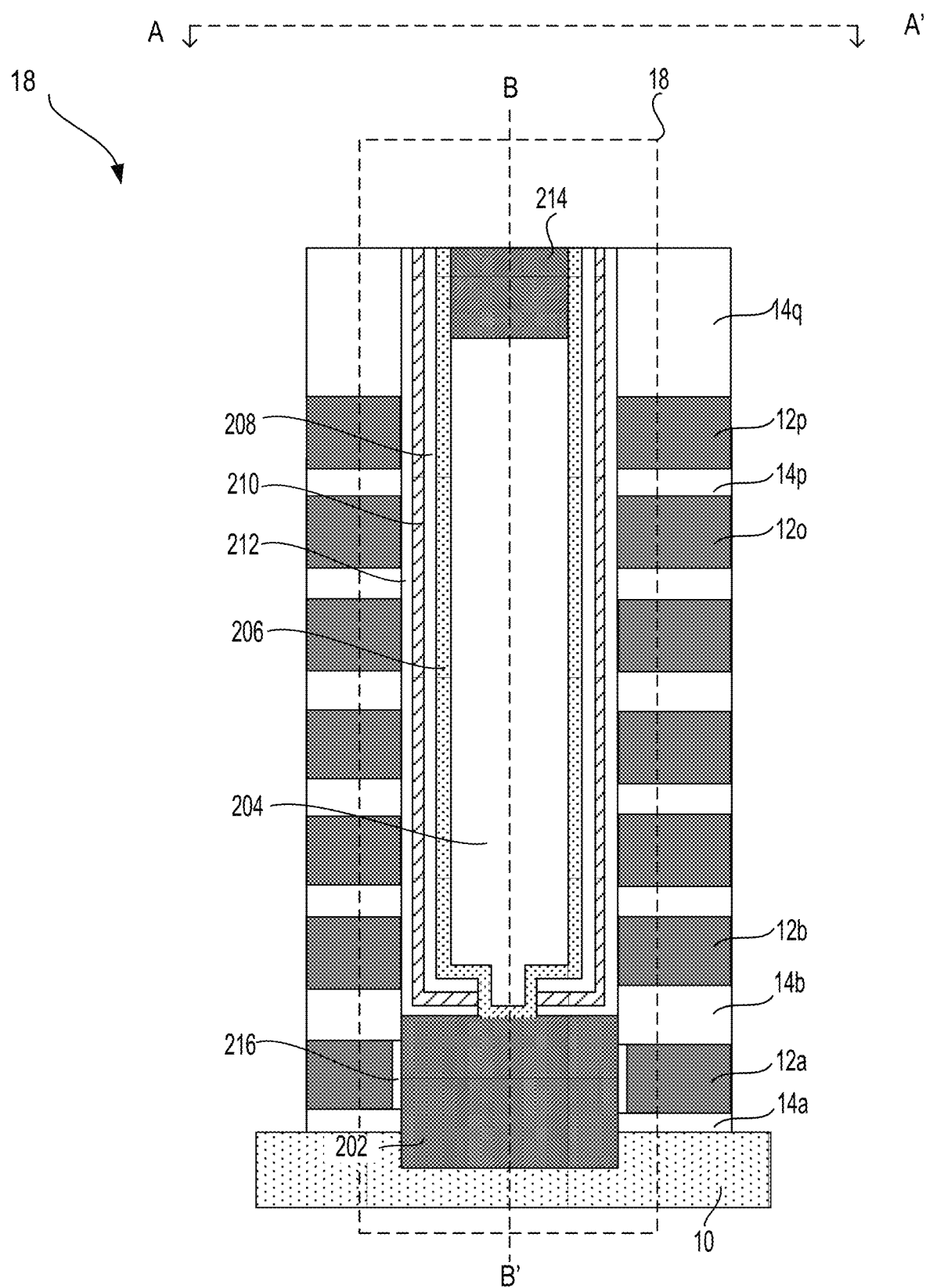
FIG. 3 is a cross-sectional view of exemplary channel structure, in accordance with exemplary embodiments of the disclosure.

FIG. 3 is a cross-sectional view of an exemplary channel structure 18. The cross-sectional view of the channel structure in FIG. 3 is obtained from a plane same as the vertical plane containing line A-A' in FIG. 2A. As shown in FIG. 3, the channel structure 18 can have a cylindrical shape with sidewalls and a bottom region. Of course, other shapes are possible. The channel structure 18 is formed along the Z-direction perpendicular to the substrate 10, and electrically coupled with the substrate 10 via a bottom channel contact 202 that is positioned at the bottom region of the channel structure. The channel structure 18 further includes a channel layer 206, a tunneling layer 208, a charge trapping layer 210, and a barrier layer 212. The barrier layer 212 is formed along the sidewalls of the channel structure 18 and over the bottom channel contact 202. The barrier layer 212 is in direct contact with the word line layers 12 and the insulating layers 14. The charge trapping layer 210 is formed along the barrier layer 212 and over the bottom channel contact 202, and the tunneling layer 208 is formed along the charge trapping layer 210 and over the bottom channel contact 202. The channel layer 206 has side portions that are formed along the tunneling layer 208 and has a T-shaped bottom portion that extends through bottom portions of the tunneling layer 208, the charge trapping layer 210, and the barrier layer 212, where the bottom portions of the tunneling layer 208, the charge trapping layer 210, and the barrier layer 212 are positioned over the bottom channel contact 202. The T-shaped bottom portion of the channel layer 206 further is positioned over the bottom channel contact 202 and is in direct contact with the bottom channel contact 202. In addition, the tunneling layer 208, the charge trapping layer 210, and the barrier layer 212 can form an "L-foot" configuration in the channel structure 18. The L-foot configuration can include side portions that are formed along the sidewalls of the channel structure 18 and a bottom portion over the bottom channel contact 202.

The channel structure 18 can also have a channel insulating layer (also referred to as dielectric layer, or isolation layer) 204 that is formed along the channel layer 206 to fill the channel structure 18. The channel insulating layer 204 can have a T-shaped bottom portion that extends through bottom portions of the channel layer 206, the tunneling layer 208, the charge trapping layer 210, and the barrier layer 212 and lands on the channel layer 206. In some embodiments, the channel insulating layer 204 can include a void that is positioned in a middle position of the channel insulating layer 204. The channel structure 18 can further include a top channel contact 214 that is formed along the channel insulating layer 204 and in direct contact with the channel layer 206. The top channel contact 214 is positioned above the TSG layer 12p to prevent any electrical interference between the top channel contact 214 and the TSG layer 12p. In the channel structure 18, a gate dielectric layer 216 is further formed between the BSG layer 12a and the bottom channel contact 202. The gate dielectric layer 216 can be positioned between the insulating layer 14b and 14a, and have an annular shape to surround the bottom channel contact 202.

In an embodiment of FIG. 3, the barrier layer 212 is made of SiO$_2$. In another embodiment, the barrier layer 212 can include multiple layers, such as SiO$_2$ and Al$_2$O$_3$. In an embodiment of FIG. 3, the charge trapping layer 210 is made of SiN. In another embodiment, the charge trapping layer 210 can include a multi-layer configuration, such as a SiN/SiON/SiN multi-layer configuration. In some embodiments, the tunneling layer 208 can include a multi-layer configuration, such as a SiO/SiON/SiO multi-layer configuration. In an embodiment of FIG. 3, the channel layer 206 is made of polysilicon via a furnace low pressure chemical vapor deposition (CVD) process. The channel insulating layer 204 can be made of SiO$_2$, and the top and bottom channel contacts 214 and 202 can be made of polysilicon.

Figure 4A:
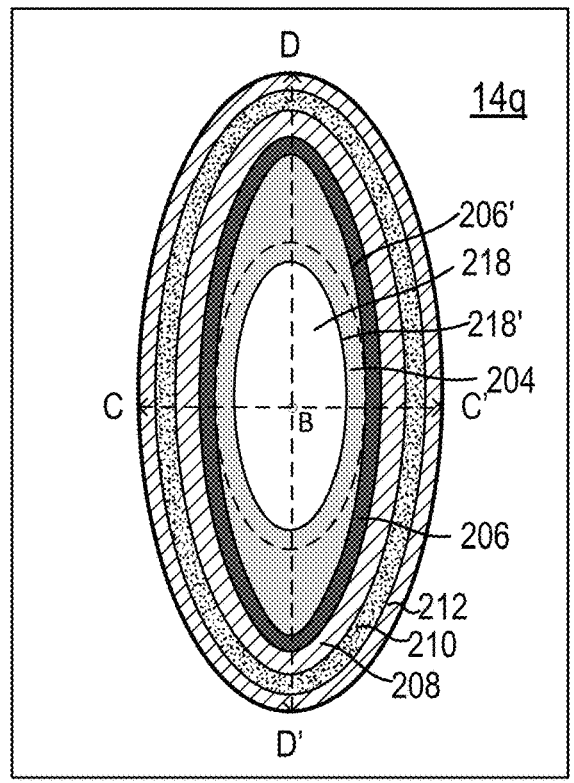
FIGS. 4A, 4B, 4C, 4D, 4E, and 4F are top-down views of first various intermediate steps of manufacturing a channel structure, in accordance with exemplary embodiments of the disclosure.

FIGS. 4A, 4B, 4C, 4D, 4E and 4F are top-down views showing cross-sections of first various intermediate steps of manufacturing a channel structure, in accordance with exemplary embodiments of the disclosure. As shown in FIG. 4A, a pre-channel structure 400 can be formed in the word line layers 12 and the insulating layers 14. The pre-channel structure 400 can have an oval cross-section. The oval cross-section can be perpendicular to a vertical axis B-B' and include a short axis C-C' and a long axis D-D'. The pre-channel structure 400 can have a barrier layer 212, a charge trapping layer 210, a tunneling layer 208, and a channel layer 206 that are concentrically arranged around the vertical axis B-B'. An insolation layer 204 can further be formed along an inner surface of the channel layer 206, and a gap 218 can be formed in the pre-channel structure 400 and surrounded by the isolation layer 204.

In order to form the pre-channel structure 400, a channel hole (not shown) can be formed through a pattering process that can include a photolithograph process and an etching process. The channel hole can extend through the word line layers 12 and the insulating layers 14 along the vertical direction. The channel hole can have sidewalls, a bottom, and an oval cross-section that is perpendicular to the vertical axis B-B' and include the short axis C-C' and the long axis D-D'. A barrier layer 212 can subsequently be formed along the sidewalls of the channel hole, where the barrier layer 212 can be concentrically positioned around the vertical axis B-B' and in direct contact with the word line layers 12 and the insulating layers 14. A charge trapping layer 210 can be formed over an inner surface of the barrier layer 212. A tunneling layer over 208 can be formed over an inner surface of the charge trapping layer 210. A channel layer 206 can be formed over an inner surface of the tunneling layer 208.

Further, an isolation layer 204 can be formed over an inner surface of the channel layer 206. In some embodiments, by precisely controlling the thickness of the isolation layer 204, a gap 218 can be formed in the pre-channel structure 400 and surrounded by the isolation layer 204. As shown in FIG. 4A, a distance between an edge 218' of the gap 218 and the inner surface 206' of the channel layer 206 along the short axis C-C' is smaller than a distance between the edge 218' of the gap 218 and the inner surface 206' of the channel layer 206 along the long axis D-D'.

Figure 4B:
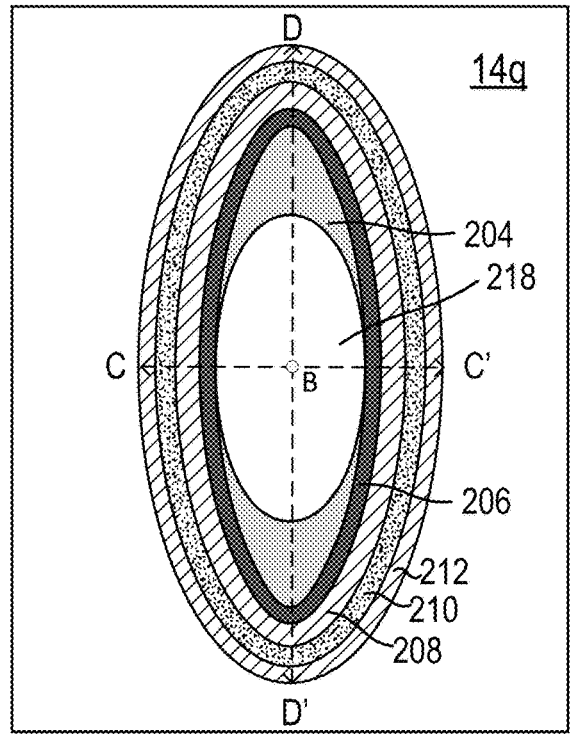

In FIG. 4B, an etching process, such as a wet etching process or a dry etching process, can be applied to etch the pre-channel structure 400. The etching process can remove a portion of the isolation layer 204 by controlling the etching conditions, such as the time, temperature, or etchant types. In some embodiments, the etching process can be a blanket etching process. Thus, an etch mask is not required during the etching process. FIG. 4B shows an intermediate status of the etching process, where the gap 218 can be enlarged and portions of the isolation layer 204 along the short axis C-C' can be removed fully. Accordingly, portions of the channel layer 206 along the short axis C-C' can be uncovered by the gap 218, and portions of the channel layer 206 along the long axis D-D' can still be covered by the isolation layer 204.

Figure 4C:
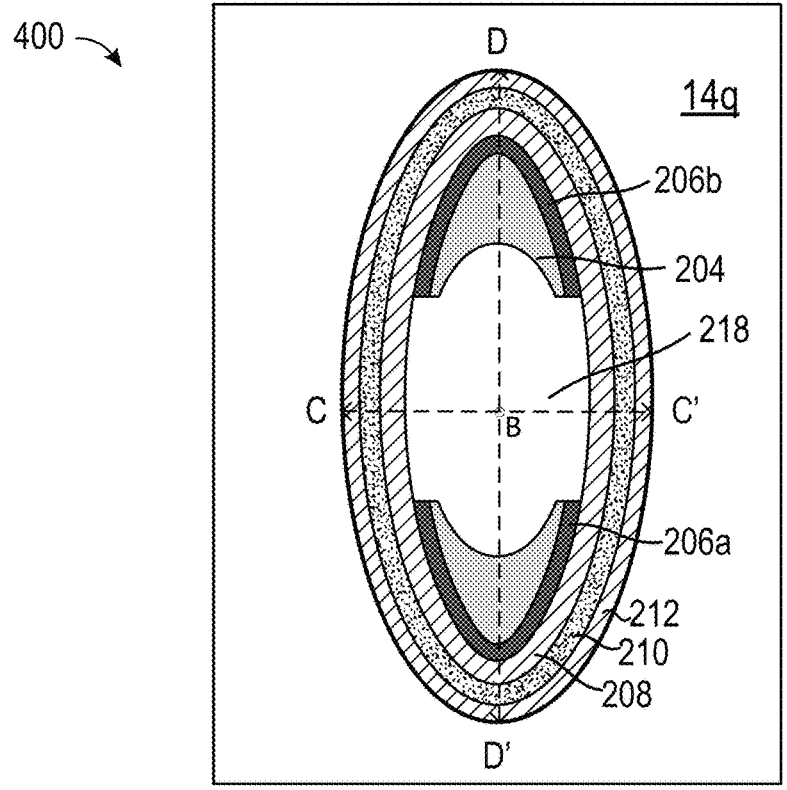

In FIG. 4C, the etching process can proceed to etch the isolation layer 204 and the portions of the channel layer 206 that are uncovered. By precisely controlling the etch time, the portions of the channel layer 206 along the short axis C-C' can be removed, and the portions of the channel layer 206 along the long axis D-D' can still remain and become channel layer sections 206a and 206b. When the etching process is completed, the channel layer 206 is etched into an open-loop configuration with channel layer sections 206a-206b that are arranged along the long axis D-D'. In addition, the gap 218 can extend along the short axis C-C' to uncover the inner surface of the tunneling layer 208.

Figure 4D:
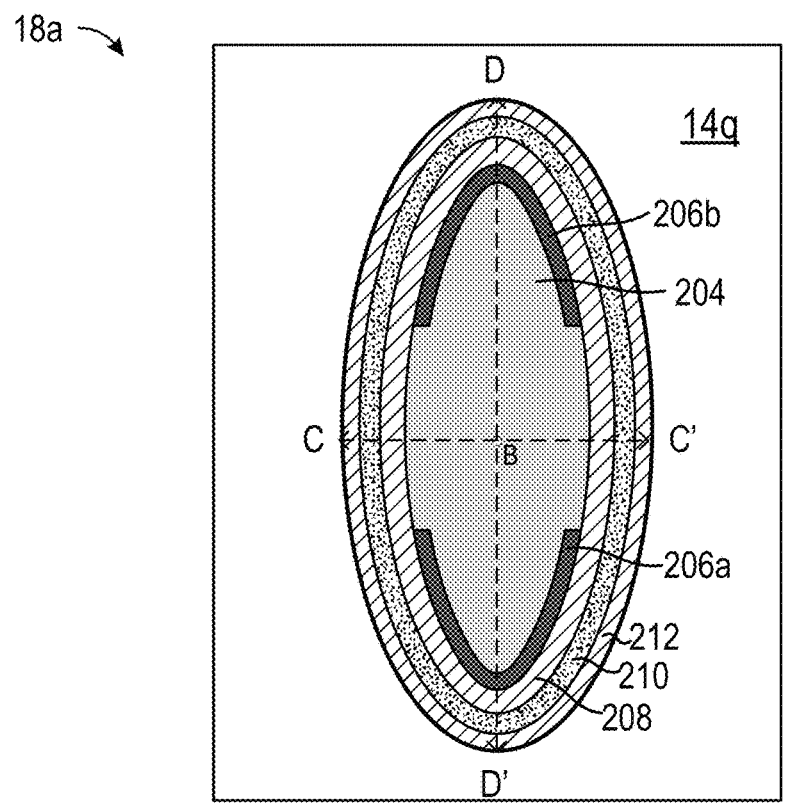

In FIG. 4D, a dielectric film can be deposited into the gap to fill the gap 218. In some embodiments, the dielectric film can be made of a same material as the isolation layer 204, such as SiO or SiN. Thus, the dielectric film filled in the gap 218 and the remaining isolation layer 204 become the dielectric layer 204. When the dielectric film is filled in the gap 218, a channel structure 18a can be formed. The channel structure 18a can have similar configurations to the channel structure 18a in FIG. 2A. For example, the channel layer sections 206a and 206b are arranged along the long axis D-D' and spaced apart from one another the dielectric layer 204.

In another embodiment, after the channel layer 206 is etched into the open-loop configuration as shown in FIG. 4C, portions of the tunneling layer 208 along the short axis C-C' can be uncovered, and portions of the tunneling layer 208 along the long axis D-D' can still be protected by the isolation layer 204. The etching process can further proceed to etch away the portions of the tunneling layer 208 that are uncovered along the short axis C-C' and uncover portions of the charge trapping layer 210 along the short axis C-C'. Portions of the charge trapping layer 210 along the long axis D-D' can still remain due to the protection of the isolation layer 204. By precisely controlling the etching conditions, the etching process can stop at the inner surface of the barrier layer 212.

Figure 4E:
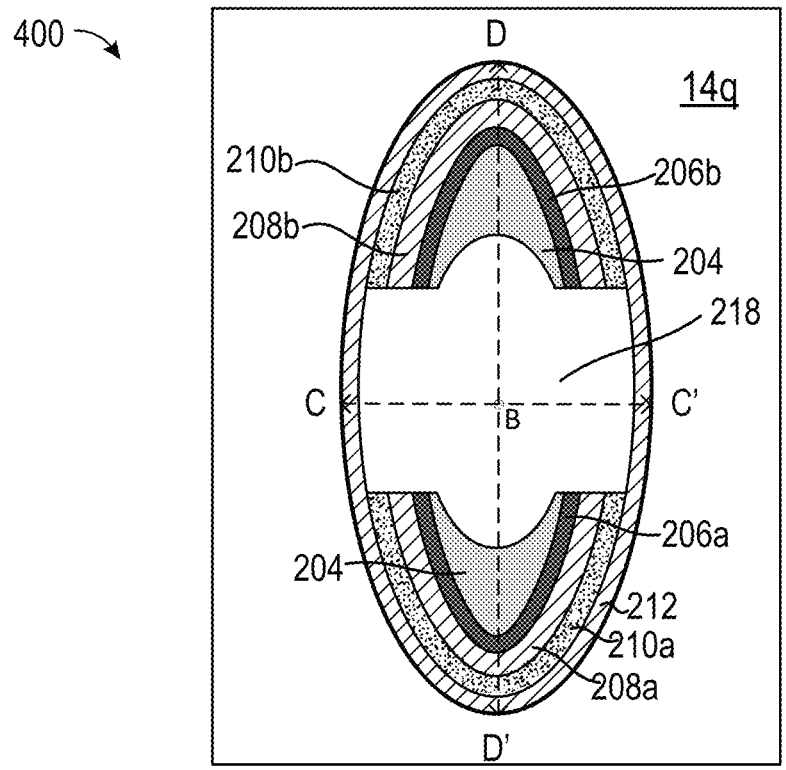

An exemplary embodiment of the etching process to etch the tunneling layer 208 and the charge trapping layer 210 can be illustrated in FIG. 4E. As shown in FIG. 4E, the gap 218 can be extended along the short axis C-C' and the long axis D-D' by the etching process. The portions of the tunneling layer 208 that still remain become tunneling layer sections 208a and 208b. The tunneling layer sections 208a and 208b can be spaced apart from one another and arranged along the long axis D-D'. The portions of the charge trapping layer 210 that still remain become charge trapping layer sections 210a and 210b. The charge trapping layer sections 210a and 210b can be spaced apart from one another and arranges along the long axis D-D'.

Figure 4F:
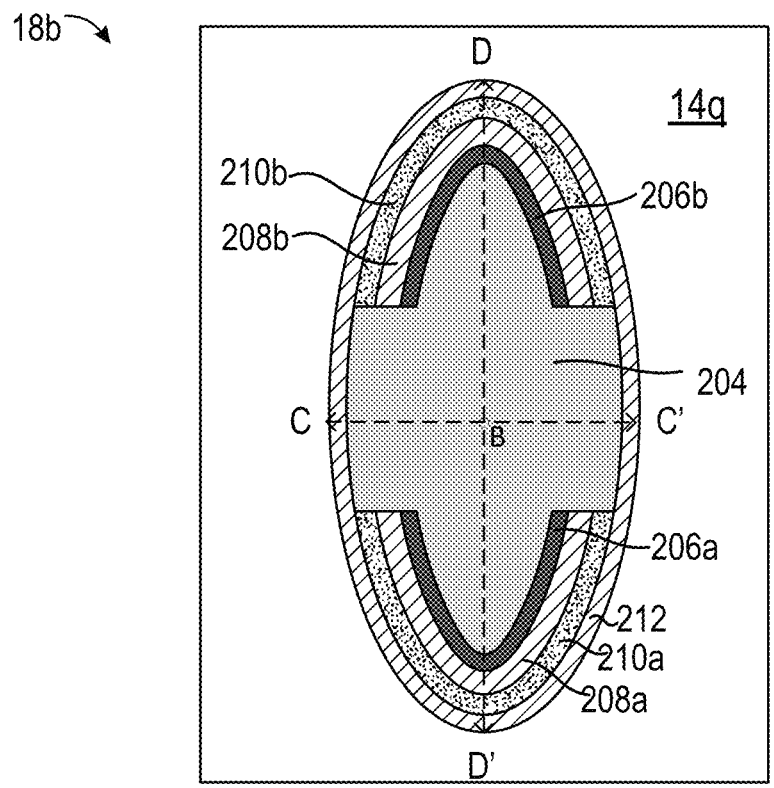

In FIG. 4F, a dielectric film can be deposited into the gap 218 to fill the gap. The dielectric film can be made of a same material as the isolation layer 204. The dielectric film and the remaining isolation layer thus become the dielectric layer 204. Accordingly, a channel structure 18b can be formed. The channel structure 18d can have similar configurations to the channel structure 18b shown in FIG. 2B.

Figure 5A:
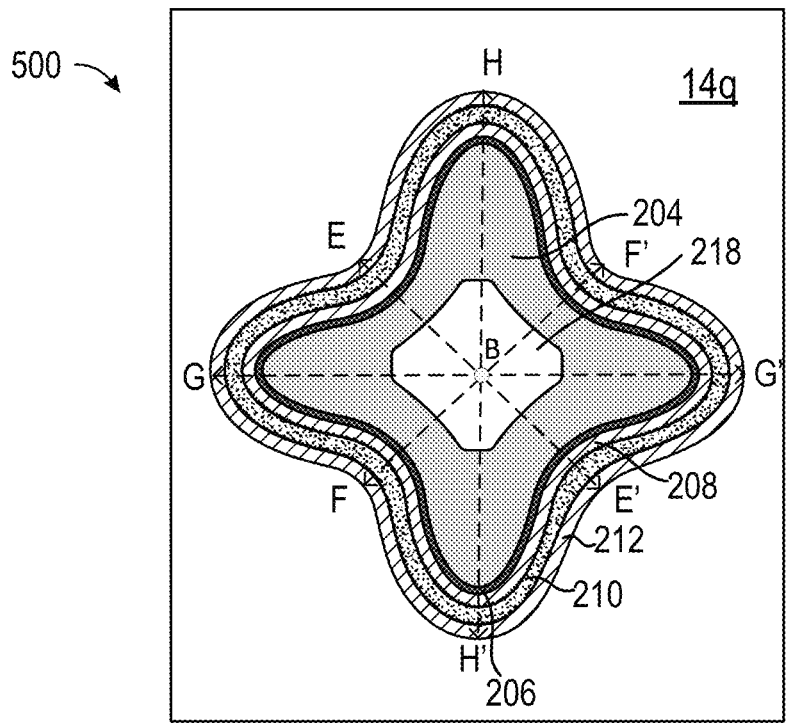
FIGS. 5A, 5B, 5C, and 5D are top-down views of second various intermediate steps of manufacturing a channel structure, in accordance with exemplary embodiments of the disclosure.

FIGS. 5A, 5B, 5C, and 5D are top-down views showing cross-sections of second various intermediate steps of manufacturing a channel structure, in accordance with exemplary embodiments of the disclosure. As shown in FIG. 5A, a pre-channel structure 500 can be formed in the word line layers 12 and the insulating layers 14. The pre-channel structure 500 can have a quatrefoil cross-section that is perpendicular to a vertical axis B-B'. The quatrefoil profile can have short axes E-E' and F-F', and long axes G-G' and H-H'. The pre-channel structure 500 can have a barrier layer 212, a charge trapping layer 210, a tunneling layer 208, and a channel layer 206 that are concentrically arranged around the vertical axis B-B'. An insolation layer 204 can further be formed along an inner surface of the channel layer 206, and a gap 218 can be formed in the pre-channel structure 500 and surrounded by the isolation layer 204. A thickness of the isolation layer 204 along the short axes (e.g., E-E' and F-F') can be smaller than a thickness of the isolation layer 204 along the long axes (e.g., G-G' and H-H') due to the anisotropic cross-section of the pre-channel structure 500.

Figure 5B:
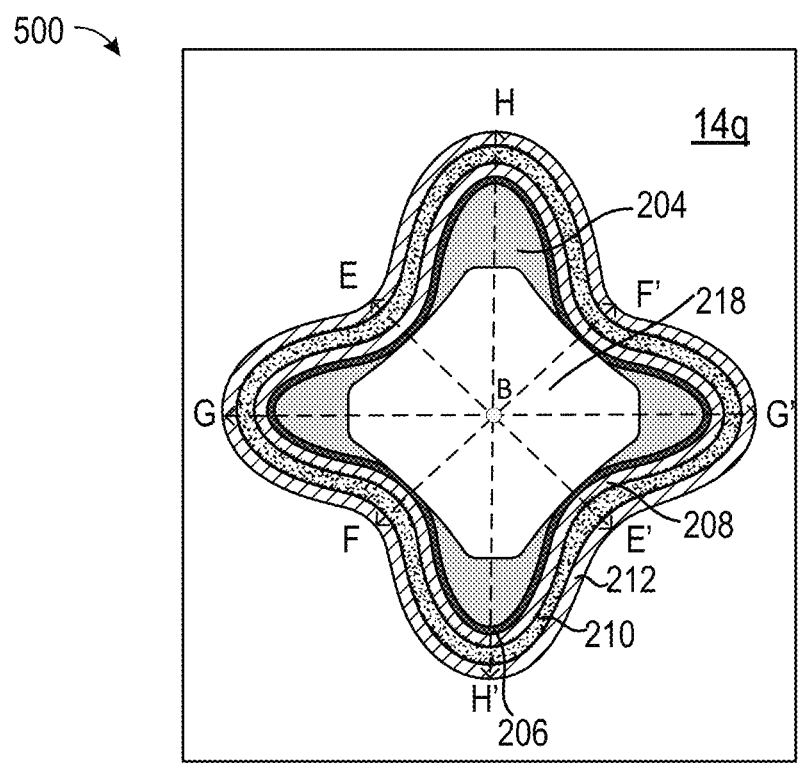

In FIG. 5B, an etching process can be applied to etch the isolation layer 204. The etching process can be a blanket etching process that etches the isolation layer 204 isotopically. Thus, portions of the isolation layer 204 along the short axes can be removed fully, and portions of the isolation layer 204 along the long axes can still remain. Accordingly, portions of the channel layer 206 along the short axes (e.g., E-E' and F-F') can be uncovered by the etching process and portions of the channel layer 206 along the long axes (e.g., G-G' and H-H') can still be protected by the isolation layer 204.

Figure 5C:
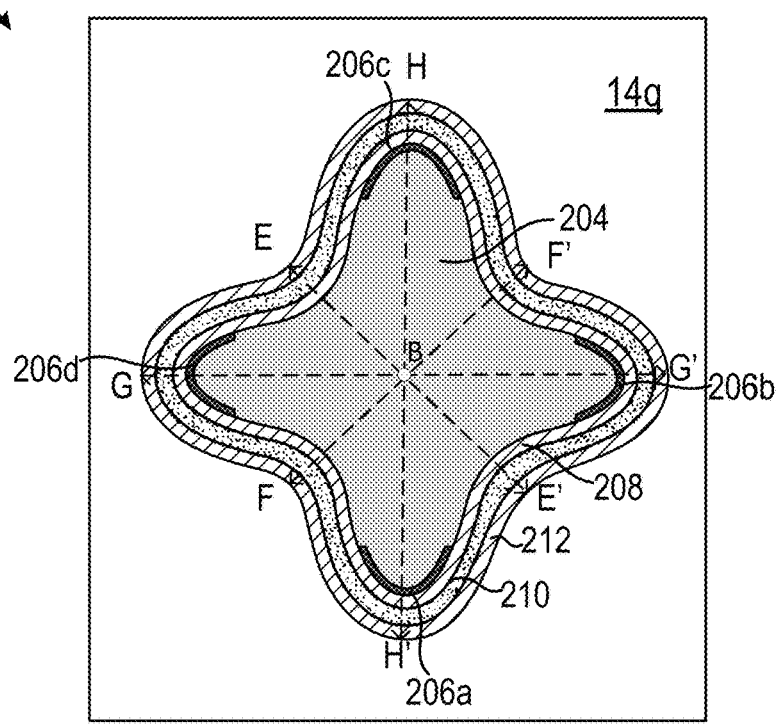

In FIG. 5C, the portions of the channel layer 206 along the short axes can be removed by the etching process, and the portions of the channel layer 206 along the long axes can still remain. A dielectric film can subsequently be filled in the gap 218. In some embodiments, the dielectric film can be made of a same material as the isolation layer 204. Thus, the dielectric film and the isolation layer 204 that still remains become a dielectric layer 204. When the dielectric film is filled in the gap 218, a channel structure 18c can be formed that has similar configurations to the channel structure 18c illustrated in FIG. 2C. As shown in FIG. 5C, portions of the channel layer 206 along the short axes are removed and portions of the channel layer 206 along the long axes still remains. The remaining portions of the channel layer 206 along the long axes become channel layer sections 206a-206d that are positioned along the long axes and spaced apart from one other by the dielectric layer 204.

Figure 5D:
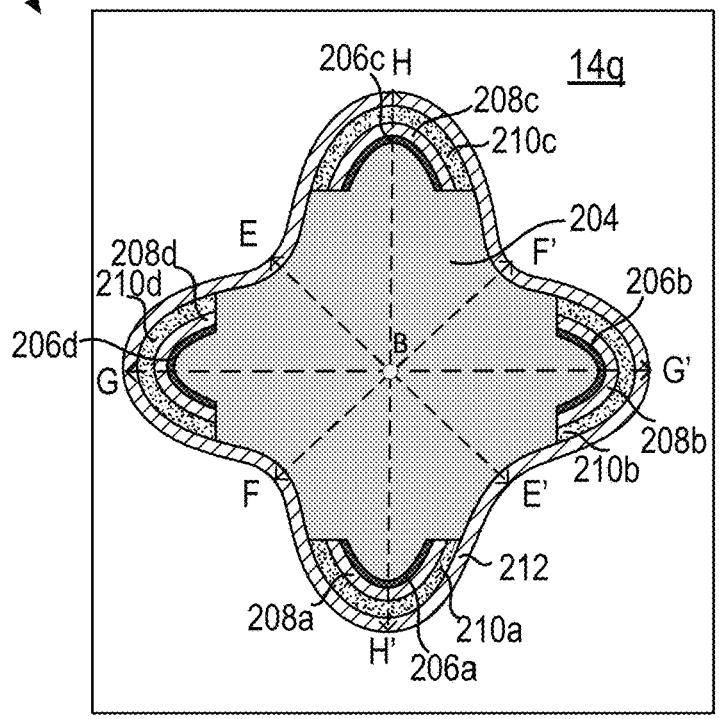

In another embodiment, as shown in FIG. 5D, the etching process can also etch the tunneling layer 208 and the charge trap layer 210. Due to the anisotropic cross-section of the pre-channel structure 500, portions of the tunneling layer 208 and the charge trap layer 210 along the short axes can be removed and portions of the tunneling layer 208 and the charge trap layer 210 along the long axes can still remain. The remaining portions of the tunneling layer 208 and the charge trapping layer 210 become tunneling layer sections 208a-208d and charge trapping layer sections 210a-210d that are positioned along the long axes. Further, the dielectric film can be deposited to fill in the gap 218. A channel structure 18d can then be formed when the gap is filled with the dielectric film. As shown in FIG. 5D, the channel structure 18d can have similar configurations to the channel structure 18d illustrated in FIG. 2D. For example, the channel layer sections 206a-206d, the tunneling layer sections 208a-208d, and the charge trapping layer sections 210a-210d are arranged along the long axes and spaced part form one another by the dielectric layer 204.

Figure 6:
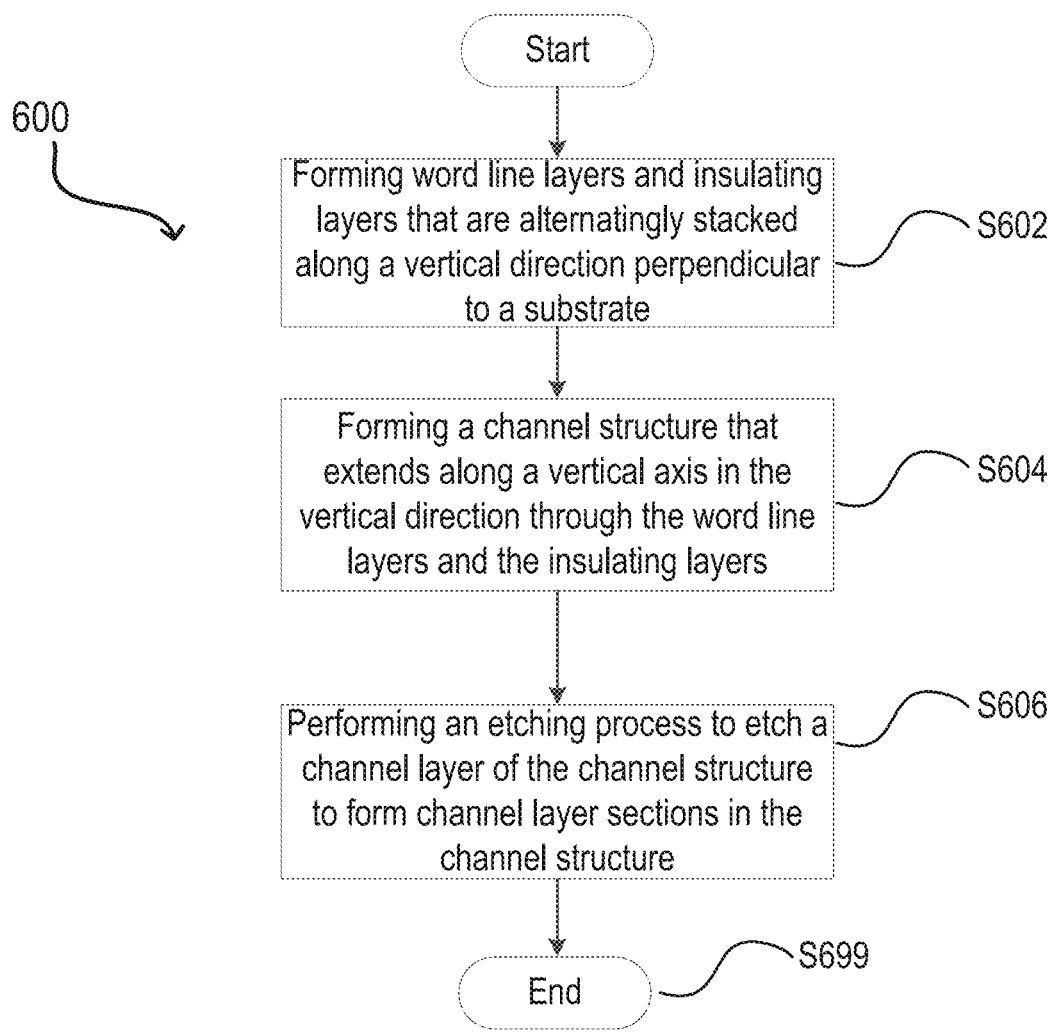
FIG. 6 is a flowchart of a process for manufacturing a 3D-NAND device, in accordance with exemplary embodiments of the disclosure.

FIG. 6 is a flowchart of a process 600 for manufacturing the disclosed 3D-NAND device in accordance with some embodiments of the present disclosure. The process 600 begins at step S602 where word line layers and insulating layers are formed. The word lien layers and insulating layers can be alternatingly stacked along a vertical direction perpendicular to a substrate of the semiconductor device. In some embodiments, the process 600 can have a gate-first fabrication technology, where the word line layers can be formed before the channel structures are formed. Accordingly, at step S602, the word line layers can be formed and can include polysilicon and/or $WSi_x$. In some embodiments, the process 600 can have a gate-last fabrication technology, where the word line layers are formed after the channel structures are formed. Thus, at step S602, sacrificial layers instead of word line layers can be formed. The sacrificial layers can be dielectric layers, such as SiN layers. In some embodiments, the steps S602 can be performed as illustrated with reference to FIG. 1.

At step S604, a channel structure can be formed. The channel structure can extend along a vertical axis in the vertical direction through the word line layers and the insulating layers. A cross-section of the channel structure that is perpendicular to the vertical axis can include a short axis and a long axis. In some embodiments, the cross-section of the channel structure can have an oval profile, a star profile, a trefoil profile, or a quatrefoil profile. In addition, when the process 600 has the gate-last fabrication technology, the sacrificial layers formed at step S602 can be replaced with conductive layers to form the word line layers. The conductive layers can include conductive materials, such as tungsten, and high-K materials, such as AlO, HfO, and TaO. In some embodiments, the steps S604 can be performed as illustrated with reference to FIG. 4A or FIG. 5A.

The process 600 then proceeds to step S606. At step S606, an etching process can be performed to etch a channel layer of the channel structure to form channel layer sections in the channel structure, where the channel layer sections are separately arranged on opposite sides of the vertical axis along the long axis of the cross-section. In some embodiments, the etching process can further etch a tunneling layer of the channel structure to form tunneling layer sections, and etch a charge trapping layer of the channel structure to form charge trapping layer sections. In some embodiments, a dielectric layer can further be deposited to fill in a gap positioned in the channel structure. In some embodiments, the steps S606 can be performed as illustrated with reference to FIGS. 4B-4F, or FIGS. 5B-5D.

It should be noted that additional steps can be provided before, during, and after the process 600, and some of the steps described can be replaced, eliminated, or performed in different order for additional embodiments of the process 600. For example, word line contacts in the staircase regions, and gate line split structures in the array region can be formed after the channel structures are formed. Moreover, various additional interconnect structures (e.g., metallization layers having conductive lines and/or vias) may be formed over the first and second contact structures of the 3D-NAND device. Such interconnect structures electrically connect the 3D-NAND device with other contact structures and/or active devices to form functional circuits. Additional device features such as passivation layers, input/output structures, and the like may also be formed.

The various embodiments described herein offer several advantages over related 3D-NAND devices. For example, in the related 3D-NAND devices, as the bit density of the 3D-NAND memory device increases, the alignment issue of the channel holes in different stacks (e.g., an upper stack and a lower stack) or the connection issue of the high dense channel holes formed by a double pattern is getting worse. In the disclosure, the bit density of the 3D-NAND can be improved based on split gates (or split cells). The split cells can be formed by splitting the channel layer into channel layer sections in a channel structure. Thus, a single memory cell string can be split into multiple memory cell strings. Accordingly, the issues experienced in the related 3D-NAND devices can be avoided.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   word line layers and insulating layers that are alternatingly stacked along a vertical direction perpendicular to a substrate of the semiconductor device; and
   a channel structure that extends through the word line layers and the insulating layers along the vertical direction, the channel structure including:
   a barrier layer extending in the vertical direction through ones of the word line layers and insulating layers,
   a charge trapping layer formed over an inner surface of the barrier layer,
   a tunneling layer formed over an inner surface of the charge trapping layer, and
   a channel layer arranged over an inner surface of the tunneling layer and partitioned into channel layer sections each extending in the vertical direction through the ones of the word line layers and insulating layers, wherein
   a cross-section of the channel structure that is perpendicular to the vertical direction includes the channel layer sections spaced apart from each other,
   the barrier layer is continuous at an outer surface of the channel structure in the cross-section of the channel structure,
   the channel layer sections are spaced apart from one another by a dielectric layer, and
   the tunneling layer continuously surrounds the channel layer sections and the dielectric layer in the cross-section of the channel structure.

2. The semiconductor device of claim 1, wherein the cross-section of the channel structure has one of an oval profile, a star profile, a trefoil profile, or a quatrefoil profile.

3. The semiconductor device of claim 2, wherein a ratio of a first long axis of the cross-section of the channel structure and a first short axis of the cross-section of the channel structure is in a range of ½ to ⅗.

4. The semiconductor device of claim 3, wherein a first pair of the channel layer sections are separately arranged along the first long axis of the cross-section of the channel structure.

5. The semiconductor device of claim 3, wherein a second pair of the channel layer sections are separately arranged along a second long axis of the cross-section.

6. A semiconductor device, comprising:
   an array region and a staircase region that are positioned adjacent each other and foamed in a stack of alternating word line layers and insulating layers that is formed over a substrate of the semiconductor device;

a channel structure that is disposed in the array region and extends through the stack along a vertical direction perpendicular to the substrate, the channel structure including:
- a barrier layer extending in the vertical direction through ones of the word line layers and insulating layers,
- a charge trapping layer formed over an inner surface of the barrier layer,
- a tunneling layer formed over an inner surface of the charge trapping layer, and
- a channel layer arranged over an inner surface of the tunneling layer and partitioned into channel layer sections each extending in the vertical direction through the ones of the word line layers and insulating layers; and word line contacts formed in the staircase region, the word line contacts extending from the word line layers of the staircase region along the vertical direction, wherein a cross-section of the channel structure that is perpendicular to the vertical direction includes the channel layer sections spaced apart from one another, the barrier layer is continuous at an outer surface of the channel structure in the cross-section of the channel structure, the channel layer sections spaced apart from one another by a dielectric layer, and the tunneling layer continuously surrounds the channel layer sections and the dielectric layer in the cross-section of the channel structure.

7. The semiconductor device of claim 6, wherein the cross-section of the channel structure has one of an oval profile, a star profile, a trefoil profile, or a quatrefoil profile.

8. The semiconductor device of claim 7, wherein a ratio of a first long axis of the cross-section of the channel structure and a first short axis of the cross-section of the channel structure is in a range of ½ to ⅗.

9. The semiconductor device of claim 8, wherein a first pair of the channel layer sections are separately arranged along the first long axis of the cross-section of the channel structure.

10. The semiconductor device of claim 8, wherein a second pair of the channel layer sections are separately arranged along a second long axis of the cross-section.

11. A semiconductor device, comprising:
word line layers and insulating layers that are alternatingly stacked along a vertical direction perpendicular to a substrate of the semiconductor device; and
a channel structure that extends through the word line layers and the insulating layers along the vertical direction, the channel structure including:
- a barrier layer extending in the vertical direction through ones of the word line layers and insulating layers,
- a charge trapping layer formed over an inner surface of the barrier layer,
- a tunneling layer formed over an inner surface of the charge trapping layer, and
- a channel layer arranged over an inner surface of the tunneling layer and partitioned into channel layer sections each extending in the vertical direction through the ones of the word line layers and insulating layers, wherein a cross-section of the channel structure that is perpendicular to the vertical direction includes the channel layer sections spaced apart from each other, the barrier layer is continuous at an outer surface of the channel structure in the cross-section of the channel structure, the tunneling layer is partitioned into tunneling layer sections each extending in the vertical direction through the ones of the word line layers and insulating layers, the tunneling layer sections are spaced apart from one another by a dielectric layer in the cross section of the channel structure, and the charge trapping layer continuously surrounds the tunneling layer sections and the dielectric layer in the cross section of the channel structure.

12. The semiconductor device of claim 11, wherein the cross-section of the channel structure has one of an oval profile, a star profile, a trefoil profile, or a quatrefoil profile.

13. The semiconductor device of claim 12, wherein a ratio of a first long axis of the cross-section of the channel structure and a first short axis of the cross-section of the channel structure is in a range of ½ to ⅗.

14. The semiconductor device of claim 13, wherein a first pair of the channel layer sections are separately arranged along the first long axis of the cross-section of the channel structure.

15. The semiconductor device of claim 13, wherein a second pair of the channel layer sections are separately arranged along a second long axis of the cross-section.

16. A semiconductor device, comprising:
an array region and a staircase region that are positioned adjacent each other and formed in a stack of alternating word line layers and insulating layers that is formed over a substrate of the semiconductor device;

a channel structure that is disposed in the array region and extends through the stack along a vertical direction perpendicular to the substrate, the channel structure including:
- a barrier layer extending in the vertical direction through ones of the word line layers and insulating layers,
- a charge trapping layer formed over an inner surface of the barrier layer,
- a tunneling layer formed over an inner surface of the charge trapping layer, and
- a channel layer arranged over an inner surface of the tunneling layer and partitioned into channel layer sections each extending in the vertical direction through the ones of the word line layers and insulating layers; and word line contacts formed in the staircase region, the word line contacts extending from the word line layers of the staircase region along the vertical direction, wherein a cross-section of the channel structure that is perpendicular to the vertical direction includes the channel layer sections spaced apart from one another, the barrier layer is continuous at an outer surface of the channel structure in the cross-section of the channel structure, the tunneling layer is partitioned into tunneling layer sections each extending in the vertical direction through the ones of the word line layers and insulating layers, the tunneling layer sections are spaced apart from one another by a dielectric layer in the cross section of the channel structure, and the charge trapping layer continuously surrounds the tunneling layer sections and the dielectric layer in the cross section of the channel structure.

17. The semiconductor device of claim 16, wherein the cross-section of the channel structure has one of an oval profile, a star profile, a trefoil profile, or a quatrefoil profile.

18. The semiconductor device of claim 17, wherein a ratio of a first long axis of the cross-section of the channel structure and a first short axis of the cross-section of the channel structure is in a range of ½ to ⅗.

19. The semiconductor device of claim 18, wherein a first pair of the channel layer sections are separately arranged along the first long axis of the cross-section of the channel structure.

20. The semiconductor device of claim 18, wherein a second pair of the channel layer sections are separately arranged along a second long axis of the cross-section.

* * * * *